United States Patent
Hegde et al.

(10) Patent No.: US 10,790,791 B2
(45) Date of Patent: Sep. 29, 2020

(54) AUTO ZERO OFFSET CURRENT MITIGATION AT AN INTEGRATOR INPUT

(71) Applicant: STMICROELECTRONICS ASIA PACIFIC PTE LTD, Singapore (SG)

(72) Inventors: Supriya Raveendra Hegde, Singapore (SG); Hugo Gicquel, Grenoble (FR)

(73) Assignee: STMicroelectronics Asia Pacific PTE Ltd, Singapore (SG)

( * ) Notice: Subject to any disclaimer, the term of this patent is extended or adjusted under 35 U.S.C. 154(b) by 0 days.

(21) Appl. No.: 16/184,778

(22) Filed: Nov. 8, 2018

(65) Prior Publication Data

US 2020/0153399 A1 May 14, 2020

(51) Int. Cl.
*H03F 1/02* (2006.01)
*H03F 3/45* (2006.01)

(52) U.S. Cl.
CPC ..... *H03F 3/45753* (2013.01); *H03F 3/45188* (2013.01); *H03F 3/45* (2013.01); *H03F 2200/129* (2013.01); *H03F 2200/156* (2013.01); *H03F 2200/264* (2013.01); *H03F 2200/375* (2013.01); *H03F 2200/462* (2013.01); *H03F 2200/471* (2013.01); *H03F 2203/45114* (2013.01); *H03F 2203/45116* (2013.01);
(Continued)

(58) Field of Classification Search
CPC ............. H03F 3/45753; H03F 3/45188; H03F 2203/45514; H03F 2200/462; H03F 2203/45116; H03F 2203/45174; H03F 2200/264; H03F 2200/129; H03F 2200/471; H03F 2200/156; H03F 2203/45114; H03F 2200/375; H03F 3/45183; H03F 3/45179; H03F 3/45192

USPC ........................................ 330/253, 259, 307
See application file for complete search history.

(56) References Cited

U.S. PATENT DOCUMENTS

| | | |
|---|---|---|
| 4,163,947 A | 8/1979 | Weedon |
| 4,578,646 A | 3/1986 | Maio et al. |
| 4,996,529 A | 2/1991 | Connell |

(Continued)

OTHER PUBLICATIONS

Enz et al., "Circuit Techniques for Reducing the Effects of Op-Amp Imperfections: Autozeroing, Correlated Double Sampling, and Chopper Stabilization," *Proceedings of the IEEE* 84(11):1584-1614, 1996.

(Continued)

*Primary Examiner* — Khanh V Nguyen
(74) *Attorney, Agent, or Firm* — Seed IP Law Group LLP

(57) ABSTRACT

A feedback stage for an integrator circuit is provided. The integrator receives a first input current and a second input current that include respective measurement current components and an offset current component. The integrator integrates the first input current and the second input current and generates a first output voltage and a second output voltage. The feedback stage including a transconductance amplifier detects a difference between the first output voltage and the second output voltage and sinks or sources a first output current and a second output current based on the difference between the first output voltage and the second output voltage. The first output current is additively combined with the first input current and the second output current is additively combined with the second input current to mitigate the offset current component at an input of the integrator.

21 Claims, 4 Drawing Sheets

(52) U.S. Cl.
CPC .............. *H03F 2203/45174* (2013.01); *H03F 2203/45514* (2013.01)

(56) References Cited

U.S. PATENT DOCUMENTS

| | | |
|---|---|---|
| 5,798,664 A | 8/1998 | Nagahori et al. |
| 6,049,246 A | 4/2000 | Kozisek et al. |
| 6,509,777 B2 | 1/2003 | Razavi et al. |
| 7,411,446 B2 | 8/2008 | Kao |
| 7,538,606 B2* | 5/2009 | Ripley ................. H03F 3/4508 327/124 |
| 7,573,327 B1* | 8/2009 | Pertijs ..................... H03F 3/387 327/124 |
| 7,719,351 B2* | 5/2010 | Pertijs ..................... H03F 3/387 330/9 |
| 7,880,653 B2* | 2/2011 | Hong ................... H03M 3/464 341/143 |
| 7,948,309 B2* | 5/2011 | Mak ....................... H03F 1/083 330/107 |
| 8,030,991 B2 | 10/2011 | Cha et al. |
| 8,179,195 B1* | 5/2012 | Huijsing .................. H03F 3/38 330/124 R |

OTHER PUBLICATIONS

Palmisano et al., "High Performance CMOS Current Comparator Design," *IEEE Transactions on Circuits and Systems—II: Analog and Digital Signal Processing* 43(12):785-790, 1996.

Pertijs et al., "A 140 dB-CMRR Current-Feedback Instrumentation Amplifier Employing Ping-Pong Auto-Zeroing and Chopping," *IEEE Journal of Solid-State Circuits* 45(10):2044-2056, 2010.

Wu et al., *Precision Instrumentation Amplifiers and Read-Out Integrated Circuits*, Springer Science + Business Media, New York, 2013, pp. 21-67. (50 pages).

Zheng et al., "A CMOS VGA With DC Offset Cancellation for Direct-Conversion Receivers," *IEEE Transactions on Circuits and Systems—I: Regular Papers* 56(1):103-113, 2009.

* cited by examiner

AUTO ZERO OFFSET CURRENT MITIGATION AT AN INTEGRATOR INPUT

BACKGROUND

Technical Field

This application is directed to auto zero offset current mitigation at an integrator input and, in particular, offset current mitigation using a feedback stage coupled between the integrator input and an integrator output.

Description of the Related Art

Offset current is introduced in a current measurement due to a variety of reasons. The offset current may be introduced in the current measurement due to element mismatch, flicker noise, or circuit aging, among other reasons. When the current measurement including the offset current is integrated and converted to a digital quantity, the offset current propagates throughout the system. Tuning the current steering DAC to cancel the offset current, particularly at the manufacturing stage, is challenging and time-consuming.

BRIEF SUMMARY

An integrator circuit is typically used to integrate received currents. The received currents may represent a measurement made by a sensor. The integrator integrates the received currents and outputs voltages representative of an integral of the received currents or differences thereof. An offset current may be introduced in the received currents. The offset current is an error or an undesirable component of the received currents. When the offset current is added to the received currents, the integrator output changes.

To mitigate or cancel the offset current, the integrator is provided with a feedback stage between the output of the integrator and the input of the integrator. The feedback stage is calibrated to detect the offset current. The feedback stage uses the output of the integrator to detect the offset current. The feedback stage then cancels or mitigates the offset current component during operation of the integrator.

In particular, the feedback stage, after calibration, generates output currents. The output currents are summed with the received currents. When summed, the output currents cancel the offset current from the received currents thereby negating the effect of the offset current. A differential structure is described herein, which can be extrapolated into a single-ended mode.

DETAILED DESCRIPTION

Figure 1:
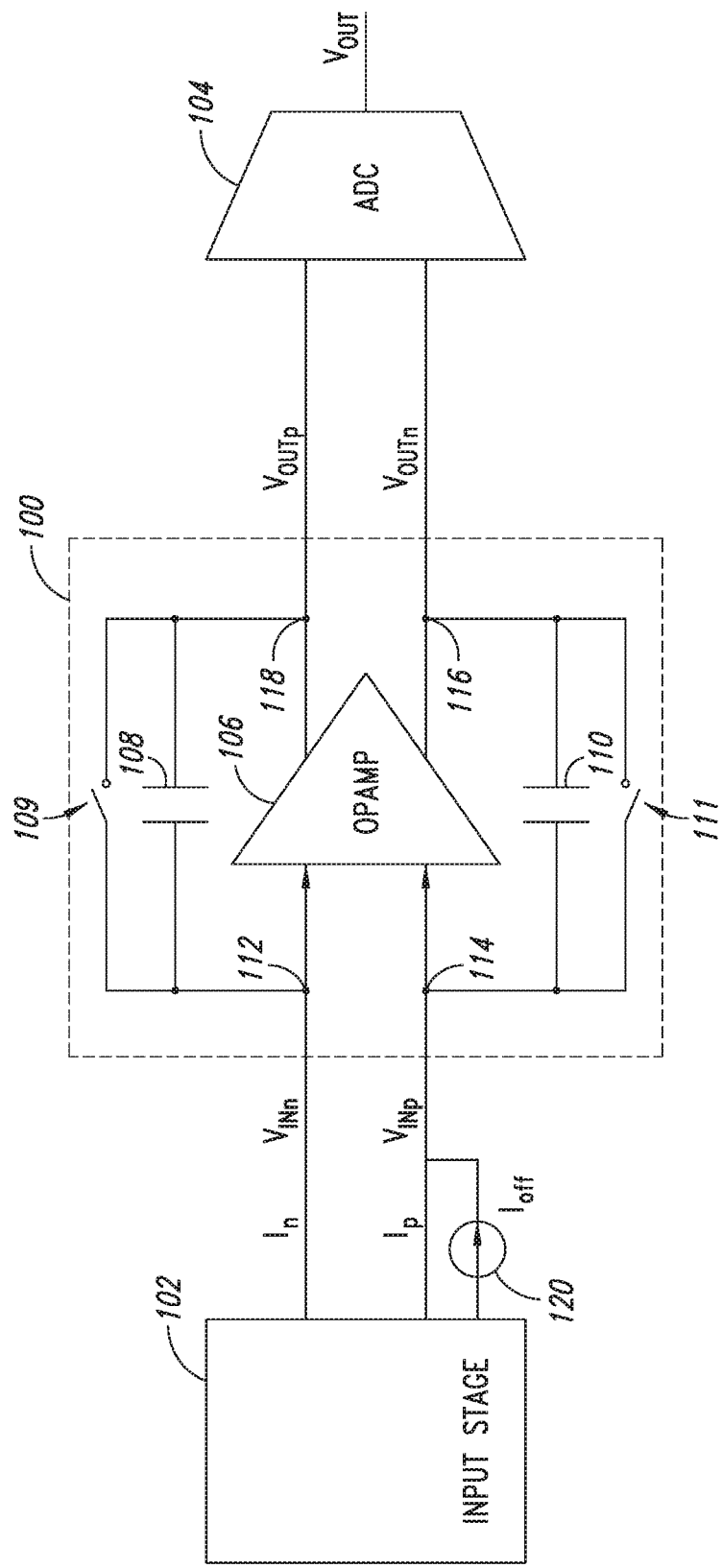
FIG. 1 shows a schematic of an integrator coupled to an input stage in differential mode.

FIG. 1 shows a schematic of an integrator 100 coupled to an input stage 102. The integrator 100 has inputs coupled to the input stage, which is shown as a current sensor. The integrator 100 has outputs coupled to an analog-to-digital converter (ADC) 104. The integrator 100 includes an operational amplifier 106, first and second capacitances 108, 110 and first and second reset switches 109, 111.

The integrator 100 has first and second (positive and negative in differential mode) inputs 112, 114, and first and second outputs 116, 118. The first capacitance 108 is coupled between the first input 112 and the second output 118 (positive and negative in differential mode). The second capacitance 110 is coupled between the second input 114 and the first output 116. The first reset switch 109 is coupled in parallel with the first capacitance 108, and the second reset switch 111 is coupled in parallel with the second capacitance 110. The operational amplifier 106 has a first input, which may be a negative voltage input or an inverting input, coupled to the first input 112 of the integrator 100. The operational amplifier 106 has a second input, which may be a positive voltage input or a noninverting input, coupled to the second input 114 of the integrator 100. The operational amplifier 106 has a first output, which may be a negative voltage output or an inverting output, coupled to the first output 116 of the integrator 100. The operational amplifier 106 has a second output, which may be a positive voltage output or a noninverting output, coupled to the second output 118 of the integrator 100.

The current sensor 102 outputs a first current (denoted '$I_n$'), which may be a negative current or an inverted current. The current sensor 102 outputs a second current (denoted '$I_p$'), which may be a positive current or a noninverted current. The first and second currents may be representative of a current measurement made by the current sensor. For example, the first and second currents may be representative of a capacitance that is sought to be measured. The first and second currents are provided to the integrator 100. The integrator 100 integrates the current difference between first and second currents and provides an output for analog-to-digital conversion by the ADC 104.

The first or second currents may include an offset current (denoted '$I_{off}$'). The offset current is additively combined with the first or second currents. In FIG. 1, the offset current is represented as being generated by a current source 120 to facilitate illustration. The offset current is also shown to be additively combined with the second current. The offset current may be produced or introduced as a result of element mismatch in the current sensor 102. The offset current may be a leakage current. The offset current may be introduced due to flicker noise, temperature, mechanical stress or aging, among others, in the input stage 102.

The offset current may be direct current (DC). In various applications, the offset current is unwanted and is not representative of a measurement made by the input stage 102. Thus, mitigation of the offset current is sought. The offset current additively combines with the first or second currents and propagates through the integrator 100 and the ADC 104, thereby affecting the ADC 104 output ($V_{OUT}$).

The integrator 100 receives a first input voltage (denoted '$V_{INn}$') at the first input 112 and a second input voltage (denoted '$V_{INp}$') at the second input 114. The first input voltage, which may be a negative input voltage or an inverted input voltage, is representative of the first current output by the current sensor 102. The second input voltage, which may be a positive input voltage or a noninverted input voltage, is representative of the second current output by the current sensor 102. The integrator 100 integrates the first and second input voltages.

The integrator 100 outputs, at the first output 116, a first output voltage (denoted '$V_{OUTn}$'). The first output voltage may be a negative output voltage or an inverted output voltage. The operational amplifier 106 outputs, at the second output 118, a second output voltage (denoted '$V_{OUTp}$'). The second output voltage may be a positive output voltage or a noninverted output voltage. The difference between the second output voltage and the first output voltage represents an integral of the difference between the second input current and the first input current. The difference may be a ramp voltage that increases over a duration of an integration period.

The first and second reset switches 109, 111 control the duration of the integration period. Initially, the first reset switch 109 is closed (i.e., transitioned to the conductive state) to short both sides of the first capacitance 108, and the second reset switch 111 is closed to short both sides of the second capacitance 110. To begin integration, the first and second reset switches 109, 111 are opened (i.e., transitioned to the nonconductive state). After the reset switches 109, 111 are opened, the reset switches 109, 111 are closed again to terminate the integration action of the integrator 100 and the integration period thereof. The duration of time between opening and closing the reset switches 109, 111 is the duration of the integration period.

Figure 2:
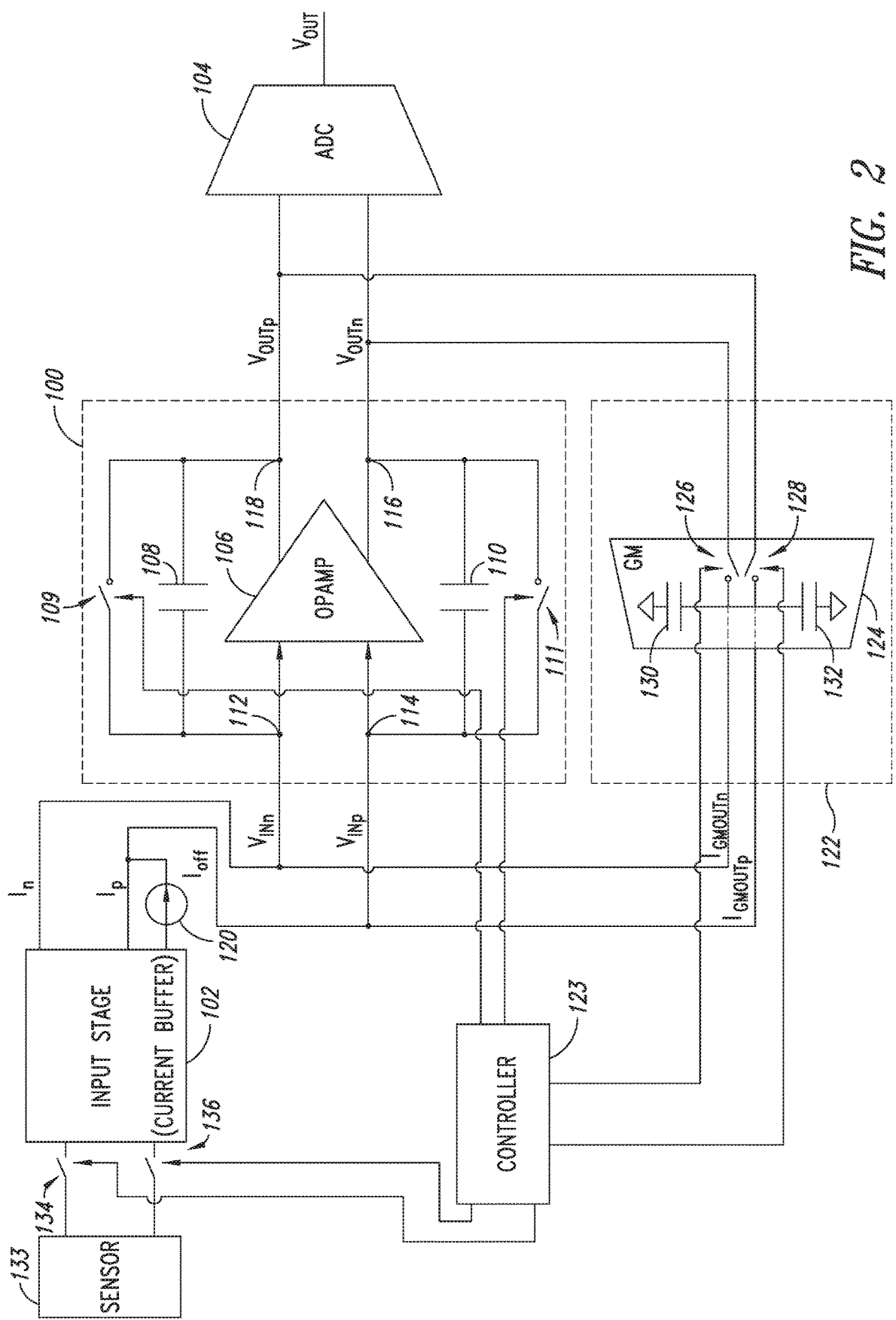
FIG. 2 shows the integrator coupled to a feedback stage and a controller for mitigating the current offset in differential mode.

FIG. 2 shows the integrator 100 coupled to a feedback stage 122 and a controller 123 for mitigating the current offset. Similar elements of the integrator 100 described with reference to FIG. 1 have the same reference numerals. The feedback stage 122 includes a transconductance amplifier 124. The feedback stage 122 includes first and second calibration switches 126, 128 and first and second calibration capacitances 130, 132 shown at internal nodes of the transconductance amplifier 124. The input stage 102, which may be a current buffer, is selectively coupled to a sensor 133 by first and second input switches 134, 136.

The controller 123 which may be a microcontroller, among others, is coupled to control terminals of the first and second reset switches 109, 111, the first and second calibration switches 126, 128 and the first and second input switches 134, 136. The controller 123 outputs respective control signals to the switches 109, 111, 126, 128, 134, 136. The control signals cause the switches 109, 111, 126, 128, 134, 136 to transition between the conductive and nonconductive states, and vice-versa. For example, when a control signal is in a first state (e.g., a logical one) the switch may be placed in the conductive state, where as when the control signal is in a second state (e.g., a logical zero) that is complementary to the first state the switch may be placed in the nonconductive state.

The transconductance amplifier 124 has first and second inputs and first and second outputs. The first input of the transconductance amplifier 124 is coupled to the first output of the integrator 100, and second input of the transconductance amplifier 124 is coupled to the second output of the integrator 100. The first output of the transconductance amplifier 124 is coupled to the first input of the integrator 100, and the second output of the transconductance amplifier 124 is coupled to the second input of the integrator 100.

The first calibration switch 126 and the first calibration capacitance 130 operate on the first output of the integrator 100 over which the transconductance amplifier 124 receives the first output voltage. The second calibration switch 128 and the second calibration capacitance 132 operate on the second output of the integrator 100 over which the transconductance amplifier 124 receives the second output voltage. In an embodiment, the connectivity of the first and second calibration switches 126, 128 and the first and second calibration capacitances 130, 132 within the transconductance amplifier 124 is described herein.

The transconductance amplifier 124 receives, at its inputs, the first and second output voltages of the integrator 100. The transconductance amplifier 124 generates first and second output currents ($I_{GMOUTn}$ and $I_{GMOUTp}$) that are a function of a difference between the first and second output voltages of the integrator. The transconductance amplifier 124 outputs the first and second output currents ($I_{GMOUTn}$ and $I_{GMOUTp}$) at its first and second outputs, respectively.

Although the term outputting is used in connection with the transconductance amplifier 124, outputting the first and second output currents ($I_{GMOUTn}$ and $I_{GMOUTp}$) refers herein to the acts of both or either of sourcing current and sinking current. The transconductance amplifier 124 may output current by sinking, drawing or pulling in the current. The transconductance amplifier 124 may also output current by sourcing or putting out the current. The transconductance amplifier 124, which may be any voltage-controlled current source, may have push-pull outputs.

When the offset current ($I_{Off}$) is present in the first current ($I_n$) or the second current ($I_p$), the offset current is integrated by the integrator 100 and reflected in the first output voltage ($V_{OUTn}$) and the second output voltage ($V_{OUTp}$) of the integrator 100. The transconductance amplifier 124 detects the offset current based on a difference between the first output voltage ($V_{OUTn}$) and the second output voltage ($V_{OUTp}$). The transconductance amplifier 124 outputs the offset current in its first output current ($I_{GMOUTn}$) or second output current ($I_{GMOUTp}$). The first and second output currents of the transconductance amplifier 124 are additively combined with the first and second currents ($I_n$ and $I_p$), respectively, in an equilibrium condition. The additive combination cancels or mitigates the offset current from the first and second currents ($I_n$ and $I_p$) of the input stage 102. Ideally (without internal amplifier 124 offset), both positive and negative output currents of the transconductance amplifier 124 should be half the magnitude (but an opposite direction for the positive output as usual in differential operation) as the offset current and offset current due to flicker, temperature, mechanical stress and aging is rejected.

Offset current mitigation may be performed in a calibration stage. The calibration stage may precede, in time, operation of the integrator 100. During the calibration stage, the offset current may be detected by the feedback stage 122. After the calibration stage, inputs of the feedback stage 122 may be decoupled from the output of the integrator 100. The output of the feedback stage 122, however, continues to be coupled to the input of the integrator 100. Then, operation of the integrator 100 may commence with the offset current being mitigated.

Figure 3:
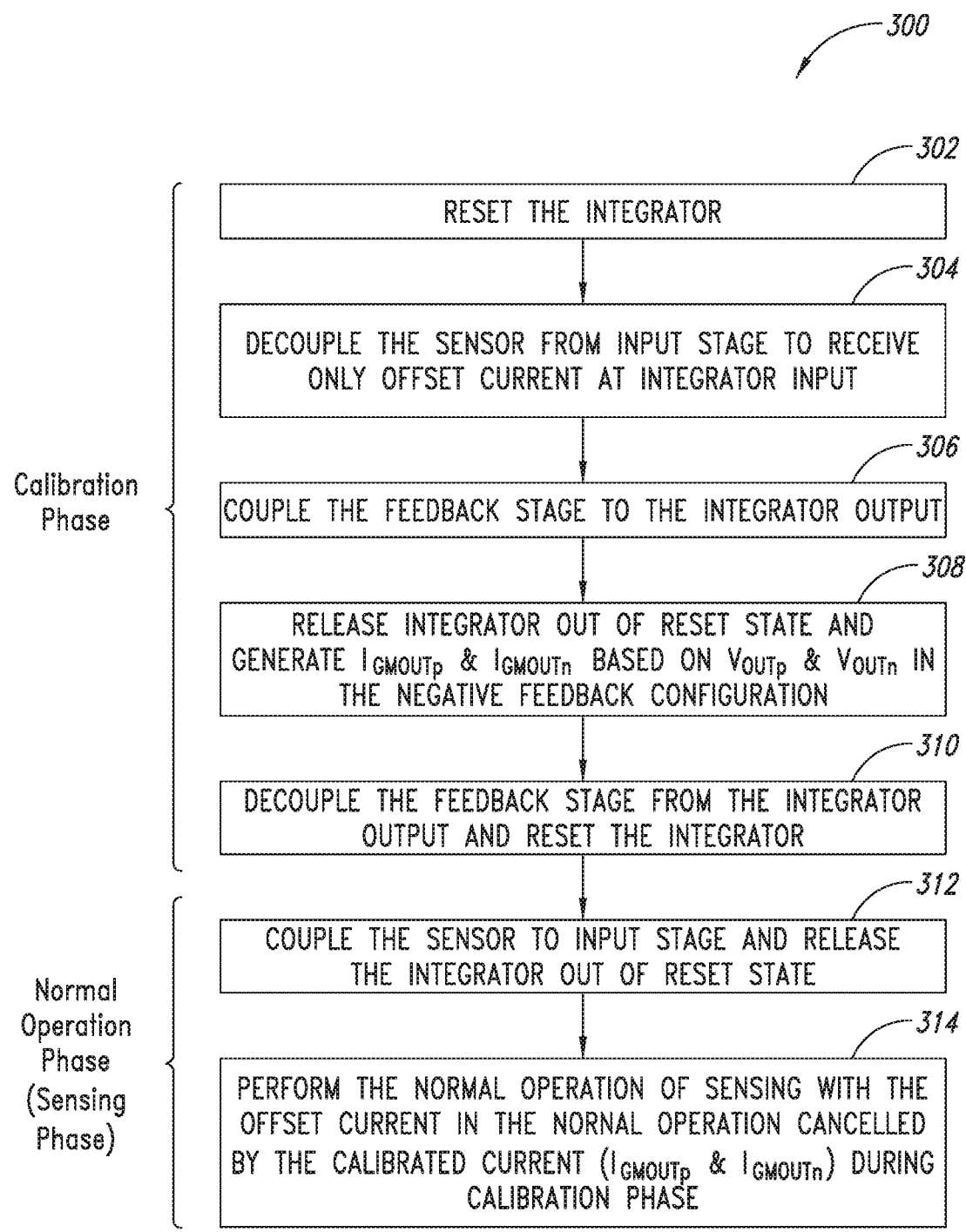
FIG. 3 shows a flow diagram of a method for calibrating the integrator for offset mitigation.

FIG. 3 shows a flow diagram of a method 300 for calibrating the integrator 100 for offset mitigation. In the method 300, a controller, such as the controller 123 described with reference to FIG. 2, resets integrator 100 at 302. The controller 123 may reset the integrator 100 by transitioning the first and second reset switches 109, 111 to the conductive state to short the sides of the first capacitance 108 and the sides of the second capacitance 110, respectively. After shorting the sides of the capacitances, the controller 123 transitions the first and second reset switches 109, 111 to the nonconductive state so that the integrator 100 can perform integration.

At 304, the controller 123 decouples the sensor 133 from the input stage 102 to detect the offset current. The controller 123 may decouple the sensor 133 from input stage 102 by transitioning the first and second input switches 134, 136 to the nonconductive state. Transitioning the first and second input switches 134, 136 decouples the sensor 133 from the input stage 102. Accordingly, the first and second currents ($I_n$ and $I_p$) are not representative of a sensed current. The first currents ($I_n$) will only include a second component representative of the offset current (without a first component representative of a current measurement). Similarly, the second currents ($I_p$) will only include second component representative of the offset current (without a first component representative of a current measurement).

The first and second currents ($I_n$ and $I_p$) may only include the offset current ($I_{Off}$) that is introduced into the currents ($I_n$ and $I_p$). As described herein, the offset current ($I_{Off}$) may be introduced into the currents ($I_n$ and $I_p$) as a result of element mismatch in the input stage 102. Decoupling the sensor 123 from input stage 102 results in the first or second currents ($I_n$ or $I_p$) being solely representative of the offset current ($I_{Off}$), whereby, for example, the offset current ($I_{Off}$) may be the only component in the first or second currents.

At 306, the controller 123 couples the feedback stage 122 to the output of the integrator 100. The controller 123 may couple the feedback stage 122 to the output of the integrator 100 by transitioning the first and second calibration switches 126, 128 of the feedback stage 122 to the conductive state.

At 308, the integrator is released from the reset state. The controller 123 may release the reset state of the integrator 100 by transitioning the first and second reset switches 109, 111 to the nonconductive state (switch open state). When the first and second reset switches of integrator 100 is open state, the first output voltage ($V_{OUTn}$) and the second output voltage ($V_{OUTp}$) of the integrator 100 are provided to and stored by the first and second calibration capacitances 130, 132 of the feedback stage 122.

The feedback stage 122 generates, at 308, the first and second output currents ($I_{GMOUTn}$ and $I_{GMOUTp}$) based on the first and second output voltages ($V_{OUTn}$ and $V_{OUTp}$) of the integrator 100. Because the first and second calibration capacitances 130, 132 store the first and second output voltages, respectively, the feedback stage 122 (and transconductance amplifier 124 thereof) continues to output the first and second output currents ($I_{GMOUTn}$ and $I_{GMOUTp}$) even after the feedback stage 122 is decoupled from the output of the integrator 100.

At 310, the controller 123 decouples the feedback stage 122 from the integrator 100 output. The controller 123 may decouple the feedback stage 122 from the integrator 100 output by transitioning the first and second calibration switches 126, 128 to the non-conductive state. After decoupling the feedback stage 122, the first and second calibration capacitances 130, 132 store the first and second output voltages representative of the offset current. Decoupling the feedback stage 122 from the integrator 100 output ensures that the feedback stage 122 does not load the integrator 100 output during operation. The integrator 100 is again reset to start the normal operation at 310. As described herein, the integrator 100 may be reset by transitioning the first and second reset switches 109, 111 to the conductive state.

The operation stage commences with coupling the sensor 133 to input stage 102 and releasing the integrator from reset state. The controller 123 may couple the sensor 133 to the input stage of the integrator 100 by transitioning the first and second input switches 134, 136 to the conductive state and release the integrator from the reset state by transitioning the first and second reset switches 109, 111 to the nonconductive state (switch open state). The input stage 102 outputs the first current ($I_n$) and second current ($I_p$) to the integrator 100. The first current ($I_n$) and second current ($I_p$) may have current levels that represent a measurement made by the sensor 133.

At 314, the integrator 100 performs integration operation with current offset mitigation based on the output of the feedback stage 122. As described herein, the first and second output currents ($I_{GMOUTn}$ and $I_{GMOUTp}$) of the feedback stage 122 are additively combined (or summed) with the first and second currents ($I_n$ and $I_p$). The first output current ($I_{GMOUTn}$) of the feedback stage 122 may have a current level that is commensurate with or the same as the current level of the current offset present in the first current ($I_n$). Summing the first output current ($I_{GMOUTn}$) with the first current ($I_n$) results in canceling or mitigating the current offset. Similarly, the second output current ($I_{GMOUTp}$) of the feedback stage 122 may have a current level that is commensurate with or the same as the current level of the current offset present in the second current ($I_p$), where summing the second output current ($I_{GMOUTp}$) with the second current ($I_p$) results in canceling or mitigating the current offset.

When the current offset is mitigated or canceled at the input of the integrator 100, the integrator 100 integrates the first and second currents (In and Ip) when they are free of the current offset. Thus, the current offset does not affect the output of the integrator 100 or propagate through the output of the integrator 100.

As described herein, it is advantageous for the first and second calibration capacitances 130, 132 to be at internal nodes of the transconductance amplifier 124 rather than input nodes of the transconductance amplifier 124. When the calibration capacitances 130, 132 are in the input nodes of the transconductance amplifier 124, the calibration capacitances 130, 132 simultaneously load the output nodes of the integrator 100. However, configuring the calibration capacitances 130, 132 at internal nodes of the transconductance amplifier 124 ensures that the calibration capacitances 130, 132 do not load the output nodes of the integrator 100.

Figure 4:
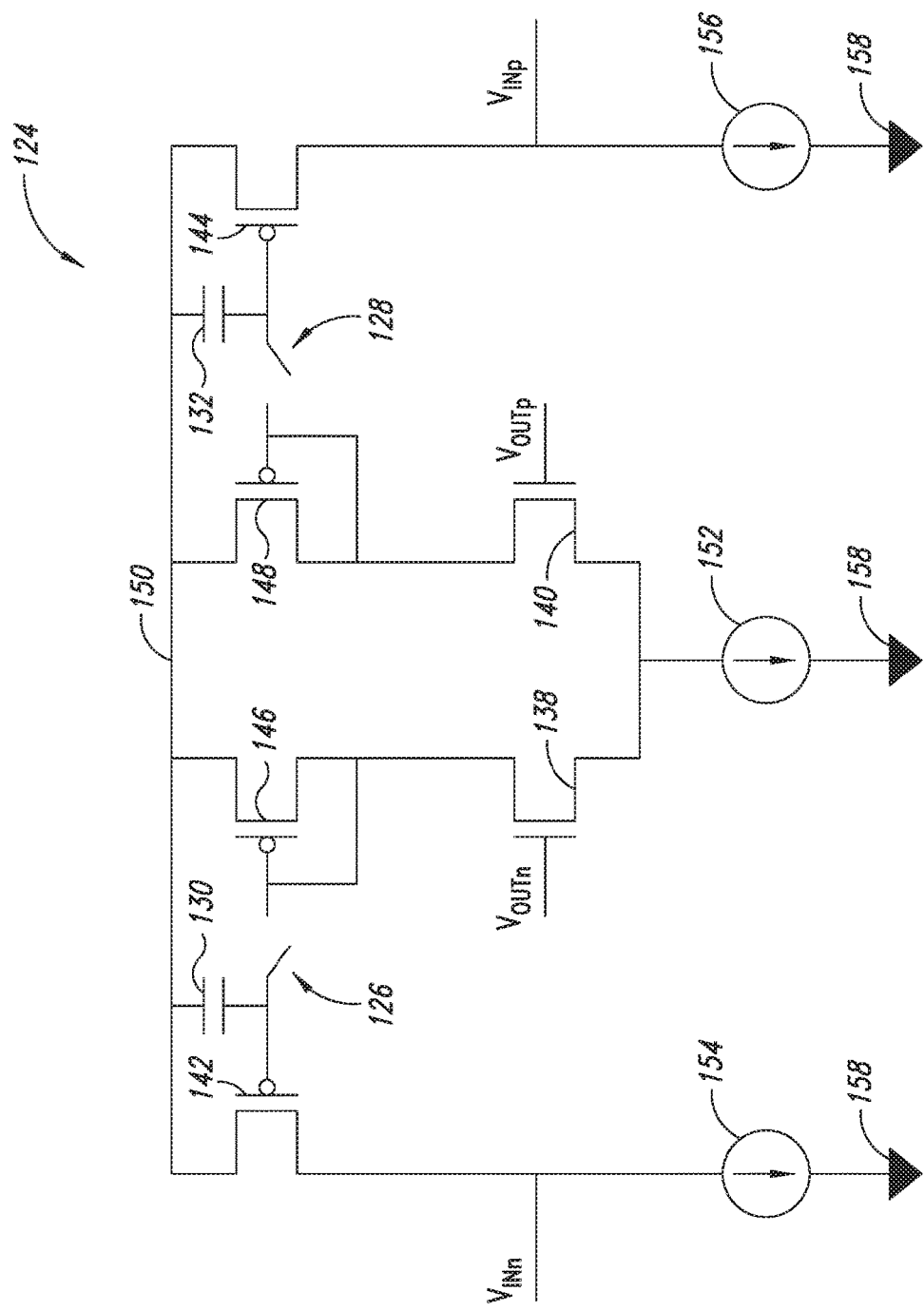
FIG. 4 shows a transconductance amplifier having the calibration capacitances at its internal nodes in differential mode.

FIG. 4 shows the transconductance amplifier 124 having the calibration capacitances 130, 132 at its internal nodes. The transconductance amplifier 124 includes first and second input transistors 138, 140, first and second output transistors 142, 144, first and second intermediary transistors 146, 148, a rail node 150, an input current source 152, first and second output current sources 154, 156 and a reference voltage node 158. The transconductance amplifier 124 also includes the first and second calibration switches 126, 128 and the first and second calibration capacitances 130, 132 described herein.

The first and second input transistors 138, 140 are shown as n-channel metal-oxide-semiconductor field-effect transistors (MOSFETs), however, in various embodiments any other type of transistor may be used. The first and second output transistors 142, 144 and the first and second intermediary transistors 146, 148 are shown as p-channel MOSFETs, however, in various embodiments any other type of transistor may be used.

The first input transistor 138 has a gate coupled to the first output of the integrator 100. The gate receives the first output voltage ($V_{OUTn}$). The first input transistor 138 has a source coupled to an anode of the input current source 152. A cathode of the input current source 152 is coupled to the reference voltage node 158. The reference voltage node 158 supplies a reference voltage, such as ground voltage. The first input transistor 138 has a drain coupled to both a drain and a gate of the first intermediary transistor 146.

The first intermediary transistor 146 has a source coupled to the rail node 150. The rail node 150 may supply a rail voltage or a source voltage. The gate and the drain of the first intermediary transistor 146 are coupled to a first conduction terminal of the first calibration switch 126. The first calibration switch 126 has a second conduction terminal coupled to both a gate of the first output transistor 142 and a first side of the first calibration capacitance 130. Although not shown in FIG. 4, the first calibration switch has a control terminal configured to receive a control signal from the controller 123 (not shown). The first calibration capacitance 130 has a second side coupled to the rail node 150.

The first output transistor 142 has a source coupled to the rail node 150 and a drain coupled to an anode of the first output current source 154. The first output current source 154 has a cathode coupled to the reference voltage node 158. The transconductance amplifier 124 outputs the first output current ($I_{GMOUTn}$) at the drain of the first output transistor 142, whereby the drain of the first output transistor 142 is coupled to the first input of the integrator 100.

The transconductance amplifier 124 has a symmetric structure. The second input transistor 140 has a gate coupled to the second output of the integrator 100. The gate receives the second output voltage ($V_{OUTp}$). The second input transistor 140 has a source coupled to an anode of the input current source 152. The second input transistor 140 has a drain coupled to both a drain and a gate of the second intermediary transistor 148. The second intermediary transistor 148 has a source coupled to the rail node 150. The gate and the drain of the second intermediary transistor 148 are coupled to a first conduction terminal of the second calibration switch 128. The second calibration switch 128 has a second conduction terminal coupled to both a gate of the second output transistor 144 and a first side of the second calibration capacitance 132. Although not shown in FIG. 4, the second calibration switch has a control terminal configured to receive a control signal from the controller 123 (not shown). The second calibration capacitance 132 has a second side coupled to the rail node 150. The second output transistor 144 has a source coupled to the rail node 150 and a drain coupled to an anode of the second output current source 156. The second output current source 156 has a cathode coupled to the reference voltage node 158. The transconductance amplifier 124 outputs the second output current ($I_{GMOUTp}$) at the drain of the second output transistor 144, whereby the drain of the second output transistor 144 is coupled to the second input of the integrator 100.

During the calibration stage the first and second calibration switches 126, 128 are in the conductive states. Thus, the first and second calibration capacitances 130, 132 are charged in accordance with the first and second output voltages ($V_{OUTn}$ and $V_{OUTp}$) of the integrator 100, respectively. When the calibration stage ends, the first and second calibration switches 126, 128 become nonconductive. As a result, the first and second calibration capacitances 130, 132 retain their charges. The charges of the first and second calibration capacitances 130, 132 continue to drive the gates of the first and second output transistors 142, 144, respectively. As a result, the first and second output transistors 142, 144 respectively output the first and second output currents ($I_{GMOUTn}$ and $I_{GMOUTp}$) in accordance with the charges of the calibration capacitances 130, 132.

In the transconductance amplifier 124, the calibration capacitances 130, 132 stored charges at internal nodes of the transconductance amplifier 124. Accordingly, the charges stored by the calibration capacitances 130, 132 do not load or supply voltage to an input or an output of the integrator 100. It is noted that in the transistor-level circuit shown in FIG. 4, the elements of feedback circuit 122 may be unmatched, which reduces implementation area because the offset generated by feedback circuit 122 is part of the total offset and will be cancelled through the auto zero operation.

In the auto-zero implementation described herein, in a cycle the feedback stage is first calibrated. After calibration, the feedback stage is put into operation. The process of calibration that is followed by operation is repeated in subsequent cycles. The auto-zero implementation reduces testing time of the integrator due to the fact that calibration is automatically performed during the course of use. The implementation described herein automatically tracks and rejects offset current offset even when the current drifts.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
an integrator configured to:
receive a first input current and a second input current, the first and second input currents including respective measurement current components, and at least one of the first input current or the second input current including an offset current component;
integrate the first input current and the second input current;
in response to integrating the first input current and the second input current, generate a first output voltage and a second output voltage; and
output the first output voltage and the second output voltage; and
a feedback stage including:
a transconductance amplifier selectively coupled to inputs and outputs of the integrator, the transconductance amplifier being configured to:
detect a difference between the first output voltage and the second output voltage; and
sink or source a first output current and a second output current at the inputs of the integrator based on the difference between the first output voltage and the second output voltage, wherein the first output current is additively combined with the first input current and the second output current is additively combined with the second input current to mitigate the offset current component in the at least one of the first input current or the second input current.

2. The device of claim 1, wherein the transconductance amplifier further includes:
a first calibration switch configured to be placed in a conductive state or a nonconductive state; and
a second calibration switch configured to be placed in the conductive state or the nonconductive state, and wherein a first feedback input is selectively coupled to a first integrator output of the outputs of the integrator via the first calibration switch and a second feedback input is selectively to a second integrator output of the outputs of the integrator via the second calibration switch.

3. The device of claim 2, comprising:
a first input switch configured to be placed in the conductive state or the nonconductive state;

a second input switch configured to be placed in the conductive state or the nonconductive state;
a sensor; and
an input stage coupled to a first integrator input and a second integrator input of the inputs of the integrator and selectively coupled to the sensor via the first input switch and the second input switch, wherein the input stage is configured to output the first input current and the second input current to the integrator.

4. The device of claim 3, comprising:
a controller, communicatively coupled to the first and second calibration switches and the first and second input switches, configured to calibrate the feedback stage by:
transitioning the first and second input switches to the nonconductive state; and
transitioning the first and second calibration switches to the conductive state.

5. The device of claim 4, wherein:
in response to transitioning the first and second input switches to the nonconductive state, the respective measurement current components are removed from the first and second input currents; and
in response to transitioning the first and second calibration switches to the conductive state, the feedback stage receives the first and second output voltages representative of the integrated offset current component without the measurement current components and sinks or sources the first and second output currents based on the integrated offset current.

6. The device of claim 4, wherein the controller is configured to, after calibrating the feedback stage, transition the feedback stage to an operational stage by:
transitioning the first and second input switches to the conductive state; and
transitioning the first and second calibration switches to the nonconductive state.

7. The device of claim 2, wherein the transconductance amplifier further includes:
a reference voltage node;
a rail node;
an input current source having a cathode coupled to the reference voltage node and an anode;
a first input transistor having a gate coupled to the first integrator output, a source coupled to the anode of the input current source, and a drain;
a first intermediary transistor having a gate and a drain coupled to each other and together coupled to both the drain of the first input transistor and a first conduction terminal of the first calibration switch;
a first calibration capacitance having a first side coupled to a second conduction terminal of the first calibration switch, and a second side coupled to the rail node;
a first output transistor having a gate coupled to both the second conduction terminal of the first calibration capacitance and the second conduction terminal of the first calibration switch, a source coupled to the rail node, and a drain coupled to a first integrator input of the inputs of the integrator; and
a first output current source having an anode coupled to the drain of the first output transistor and a cathode coupled to the reference voltage node.

8. The device of claim 7, wherein the transconductance amplifier further includes:
a second input transistor having a gate coupled to the second integrator output, a source coupled to the anode of the input current source, and a drain;
a second intermediary transistor having a gate and a drain coupled to each other and together coupled to both the drain of the second input transistor and a first conduction terminal of the second calibration switch;
a second calibration capacitance having a first side coupled to a second conduction terminal of the second calibration switch, and a second side coupled to the rail node;
a second output transistor having a gate coupled to both the second conduction terminal of the second calibration capacitance and the second conduction terminal of the second calibration switch, a source coupled to the rail node, and a drain coupled to a second integrator input of the inputs of the integrator; and
a second output current source having an anode coupled to the drain of the second output transistor and a cathode coupled to the reference voltage node.

9. A system, comprising:
an input stage configured to provide first and second input currents including respective measurement current components, at least one of the first input current or the second input current including an offset current component;
an integrator having a first integrator input, a second integrator input, a first integrator output and a second integrator output, the integrator being configured to:
receive the first input current at the first integrator input and the second input current at the second integrator input;
integrate the first input current and the second input current;
in response to integrating the first input current and the second input current, generate a first output voltage and a second output voltage; and
output the first output voltage at the first integrator output and the second output voltage at the second integrator output; and
a feedback stage including:
a transconductance amplifier having a first feedback input selectively coupled to the first integrator output, a second feedback input selectively to the second integrator output, a first feedback output coupled to the first integrator input and a second feedback output coupled to the second integrator input, the transconductance amplifier being configured to:
detect a difference between the first output voltage and the second output voltage; and
sink or source a first output current at the first feedback output and a second output current at the second feedback output based on the difference between the first output voltage and the second output voltage, wherein the first output current is additively combined with the first input current and the second output current is additively combined with the second input current to mitigate the offset current component.

10. The system of claim 9, wherein the transconductance amplifier further includes:
a first calibration switch configured to be placed in a conductive state or a nonconductive state; and
a second calibration switch configured to be placed in the conductive state or the nonconductive state, wherein the first feedback input is selectively coupled to the first integrator output via the first calibration switch and the a second feedback input is selectively to the second integrator output via the second calibration switch.

11. The system of claim 10, comprising:
a first input switch configured to be placed in the conductive state or the nonconductive state;
a second input switch configured to be placed in the conductive state or the nonconductive state;
a sensor; and
an input stage coupled to the first integrator input and the second integrator input via the second input switch and selectively coupled to the sensor via the first input switch and the second input switch, wherein the input stage is configured to output the first input current and the second input current.

12. The system of claim 11, comprising:
a controller, communicatively coupled to the first and second calibration switches and the first and second input switches, configured to calibrate the feedback stage by:
transitioning the first and second input switches to the nonconductive state; and
transitioning the first and second calibration switches to the conductive state.

13. The system of claim 12, wherein:
in response to transitioning the first and second input switches to the nonconductive state, the respective measurement current components are removed from the first and second input currents; and
in response to transitioning the first and second calibration switches to the conductive state, the feedback stage receives the first and second output voltages representative of the integrated offset current component without the measurement current components and sinks or sources the first and second output currents based on the integrated offset current.

14. The system of claim 12, wherein the controller is configured to, after calibrating the feedback stage, transition the feedback stage to an operational stage by:
transitioning the first and second input switches to the conductive state; and
transitioning the first and second calibration switches to the nonconductive state.

15. The system of claim 10, wherein the transconductance amplifier further includes:
a reference voltage node;
a rail node;
an input current source having a cathode coupled to the reference voltage node and an anode;
a first input transistor having a gate coupled to the first integrator output, a source coupled to the anode of the input current source, and a drain;
a first intermediary transistor having a gate and a drain coupled to each other and together coupled to both the drain of the first input transistor and a first conduction terminal of the first calibration switch;
a first calibration capacitance having a first side coupled to a second conduction terminal of the first calibration switch, and a second side coupled to the rail node;
a first output transistor having a gate coupled to both the second conduction terminal of the first calibration capacitance and the second conduction terminal of the first calibration switch, a source coupled to the rail node, and a drain coupled to the first integrator input; and
a first output current source having an anode coupled to the drain of the first output transistor and a cathode coupled to the reference voltage node.

16. The system of claim 15, wherein the transconductance amplifier further includes:
a second input transistor having a gate coupled to the second integrator output, a source coupled to the anode of the input current source, and a drain;
a second intermediary transistor having a gate and a drain coupled to each other and together coupled to both the drain of the second input transistor and a first conduction terminal of the second calibration switch;
a second calibration capacitance having a first side coupled to a second conduction terminal of the second calibration switch, and a second side coupled to the rail node;
a second output transistor having a gate coupled to both the second conduction terminal of the second calibration capacitance and the second conduction terminal of the second calibration switch, a source coupled to the rail node, and a drain coupled to the second integrator input; and
a second output current source having an anode coupled to the drain of the second output transistor and a cathode coupled to the reference voltage node.

17. A method, comprising:
receiving, by an integrator from an input stage, a first input current and a second input current, the first and second input currents including respective measurement current components, and at least one of the first input current or the second input current including an offset current component;
integrating, by the integrator, the first input current and the second input current;
generating, by the integrator, a first output voltage and a second output voltage;
receiving, by a feedback stage including a transconductance amplifier, the first output voltage and the second output voltage;
detecting, by the feedback stage, a difference between the first output voltage and the second output voltage; and
sinking or sourcing, by the feedback stage, a first output current and a second output current based on the difference between the first output voltage and the second output voltage; and
additively combining the first output current with the first input current and the second output current with the second input current to mitigate the offset current component at an input of the integrator.

18. The method of claim 17, comprising:
calibrating the feedback stage before generating the first output voltage and the second output voltage, calibrating the feedback stage including:
decoupling the input stage from a sensor to remove the respective measurement current components from the first input current and the second input current; and
coupling an output of the integrator to the feedback stage.

19. The method of claim 18, comprising:
coupling the input stage to the sensor to include the respective measurement current components in the first input current and the second input current; and
decoupling the output of the integrator from the feedback stage after calibrating the feedback stage.

20. The method of claim 17, wherein the transconductance amplifier further includes:
a reference voltage node;
a rail node;
an input current source having a cathode coupled to the reference voltage node and an anode;

a first input transistor having a gate coupled to the first integrator output, a source coupled to the anode of the input current source, and a drain;

a first calibration switch having a first conduction terminal and a second conduction terminal;

a first intermediary transistor having a gate and a drain coupled to each other and together coupled to both the drain of the first input transistor and the first conduction terminal of the first calibration switch;

a first calibration capacitance having a first side coupled to the second conduction terminal of the first calibration switch, and a second side coupled to the rail node;

a first output transistor having a gate coupled to both the second conduction terminal of the first calibration capacitance and the second conduction terminal of the first calibration switch, a source coupled to the rail node, and a drain coupled to the first integrator input; and a first output current source having an anode coupled to the drain of the first output transistor and a cathode coupled to the reference voltage node.

21. The method of claim 20, wherein the transconductance amplifier further includes:

a second input transistor having a gate coupled to the second integrator output, a source coupled to the anode of the input current source, and a drain;

a second calibration switch having a first conduction terminal and a second conduction terminal;

a second intermediary transistor having a gate and a drain coupled to each other and together coupled to both the drain of the second input transistor and the first conduction terminal of the second calibration switch;

a second calibration capacitance having a first side coupled to the second conduction terminal of the second calibration switch, and a second side coupled to the rail node;

a second output transistor having a gate coupled to both the second conduction terminal of the second calibration capacitance and the second conduction terminal of the second calibration switch, a source coupled to the rail node, and a drain coupled to the second integrator input; and a second output current source having an anode coupled to the drain of the second output transistor and a cathode coupled to the reference voltage node.

\* \* \* \* \*